United States Patent [19]
Yanagisawa et al.

[11] Patent Number: 5,349,208
[45] Date of Patent: Sep. 20, 1994

[54] GAP LIGHT EMITTING ELEMENT SUBSTRATE WITH OXYGEN DOPED BUFFER

[75] Inventors: Munehisa Yanagisawa, Takasaki; Susumu Higuchi; Yuuki Tamura, both of Annaka, all of Japan

[73] Assignee: Shin Etsu Handotai Kabushiki Kaisha, Tokyo, Japan

[21] Appl. No.: 147,480

[22] Filed: Nov. 5, 1993

[30] Foreign Application Priority Data

Nov. 7, 1992 [JP] Japan .................. 4-322381

[51] Int. Cl.$^5$ ........................ H01L 33/00
[52] U.S. Cl. ...................... 257/79; 257/101; 257/102; 257/103
[58] Field of Search ........... 257/102, 101, 103, 94, 257/96, 97, 79

[56] References Cited

U.S. PATENT DOCUMENTS

| | | | |
|---|---|---|---|
| 3,394,085 | 7/1968 | Westerveld et al. | 257/102 X |
| 3,603,833 | 9/1971 | Logan et al. | 257/102 X |
| 3,619,304 | 11/1991 | Naito et al. | 257/102 X |
| 3,669,767 | 6/1972 | Hackett, Jr. et al. | 257/102 X |
| 3,689,330 | 9/1972 | Dosen et al. | 257/102 X |
| 3,703,671 | 11/1972 | Saul | 257/102 X |
| 3,755,006 | 8/1973 | Casey, Jr. et al. | 257/102 X |
| 4,180,423 | 12/1979 | Naito et al. | 257/103 X |

FOREIGN PATENT DOCUMENTS

| | | | |
|---|---|---|---|
| 1445408 | 5/1966 | France | 257/102 |
| 53-63883 | 6/1978 | Japan | 257/103 |
| 53-082280 | 7/1978 | Japan . | |
| 55-103779 | 8/1980 | Japan | 257/102 |
| 4221862 | 8/1992 | Japan | 257/103 |
| 2006043 | 5/1979 | United Kingdom | 257/102 |

OTHER PUBLICATIONS

Saul et al., "Distribution of Impurities in Zn, O–Doped GaP Liquid Phase Epitaxy Layers," J. Electrochem. Soc.: Solid State Science, vol. 117, No. 7, Jul. 1970, pp. 921–924.

*Primary Examiner*—William Mintel
*Attorney, Agent, or Firm*—Robert R. Snider

[57] ABSTRACT

To obtain a GaP light emitting element substrate which provides GaP light emitting diodes with less luminance dispersion and high brightness. A GaP light emitting element substrate comprising an n-type GaP buffer layer, an n-type GaP layer and a p-type GaP layer layered one after another on an n-type GaP single crystal substrate, wherein the oxygen concentration in said n-type GaP buffer layer is kept at $6 \times 10^{15}$ [atoms/cc] or less.

1 Claim, 3 Drawing Sheets

GAP LIGHT EMITTING ELEMENT SUBSTRATE WITH OXYGEN DOPED BUFFER

BACKGROUND OF THE INVENTION

1. Field of the Invention

This invention relates to a GaP light emitting element substrate, and more specifically to a GaP light emitting element substrate comprising a substrate with a plurality of GaP layers on it which is used when manufacturing GaP light emitting diodes which emit green light.

2. Prior Art

Light emitting elements such as light emitting diodes are normally obtained by layering a plurality of semiconductor layers on a semiconductor substrate to prepare a multi-layer semiconductor substrate with a pn junction(s), and making this into elements. Of these, green light emitting diodes can be obtained by using a light emitting element substrate prepared by forming one or more layers of both n-type and p-type GaP layers, one after another, on an n-type GaP single crystal substrate.

GaP is an indirect transition type semiconductor, ant therefore the brightness is very low when a pn junction is simply formed. Therefore nitrogen (N), which would be the luminescence center, is added to the n-type GaP layer in the proximity of the pn junction to increase the light emitting output. A light emitting diode prepared from the GaP light emitting element substrate which has the nitrogen-doped n-type GaP layer, as described above, will produce a yellow-green light emission with a peak wavelength of about 567 nm.

Recently, the progress of GaP light emitting diodes which emit green light has been remarkable, and each year diodes with higher light emission outputs are developed. Along with this trend toward higher light emission output, the application range of the GaP light emitting diodes has spread to a very wide range. However, development of light emitting diodes with even higher light emission outputs is desirable in order to further expand the application range.

However, there is a problem which constitutes an obstacle when designing GaP light emitting diodes with higher brightness. The problem lies in that the brightness of the light emitting diodes varies significantly depending on the manufacturing lot of the buffer layer of the GaP light emitting element which is used in manufacturing the GaP light emitting diodes, and that sufficient brightness may not be achieved depending on the manufacturing lot.

Although the buffer layer does not directly contribute to the light emission of a light emitting diode, it seems that the quality of the buffer layer has some kind of influence on the brightness of the light emitting diode. Therefore, the brightness of the light emitting diodes is expected to improve by improving the quality of the buffer layer.

Therefore, the object of this invention is to provide a GaP light emitting substrate which allows manufacturing of GaP light emitting diodes with less dispersion of the brightness depending on the manufacturing lot of the buffer layer as well as with high brightness.

SUMMARY OF THE INVENTION

The GaP light emitting element substrate of this invention comprises an n-type GaP buffer layer, an n-type GaP layer (nitrogen (N), which would be the luminescence center, is added to said layer in the proximity of the pn junction) and a p-type GaP layer layered one after another on an n-type GaP single crystal substrate, characterized by the fact that the oxygen concentration in said n-type GaP buffer layer is made to be $6 \times 10^{15}$ [atoms/cc] or less.

The inventors earnestly conducted a study to solve the problems described above, and found out that one of the causes of the dispersion of the brightness of the GaP light emitting diodes depending on the manufacturing lot was the dispersion of the transmission characteristics of the n-type GaP buffer for the emitted green light (hereafter referred to as "emitted light"). The relationship between the transmission characteristics of the n-type GaP buffer layer for the emitted light and the brightness of the green light emitting GaP light emitting diodes will be explained below.

DETAILED DESCRIPTION OF THE INVENTION

Figure 1:
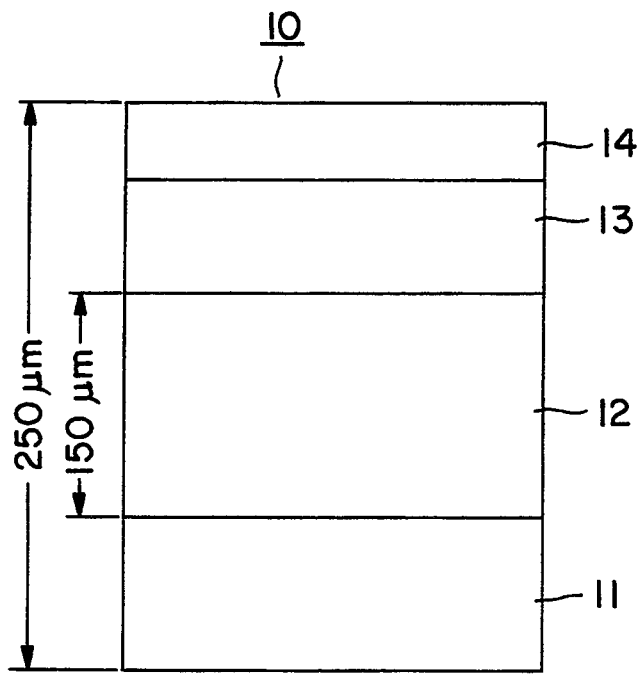
FIG. 1 is a schematic sectional view of an example of a GaP light emitting element substrate.

FIG. 1 shows the cross-sectional structure of a GaP light emitting element substrate. In this figure, the GaP luminescence element substrate 10 comprises an n-type GaP buffer layer 12, an n-type GaP layer 13 (nitrogen (N), which would be the light emitting center, is added to said layer in the proximity of the pn junction) and a p-type GaP layer 14 layered one after another on a GaP single crystal substrate 11.

Figure 2:
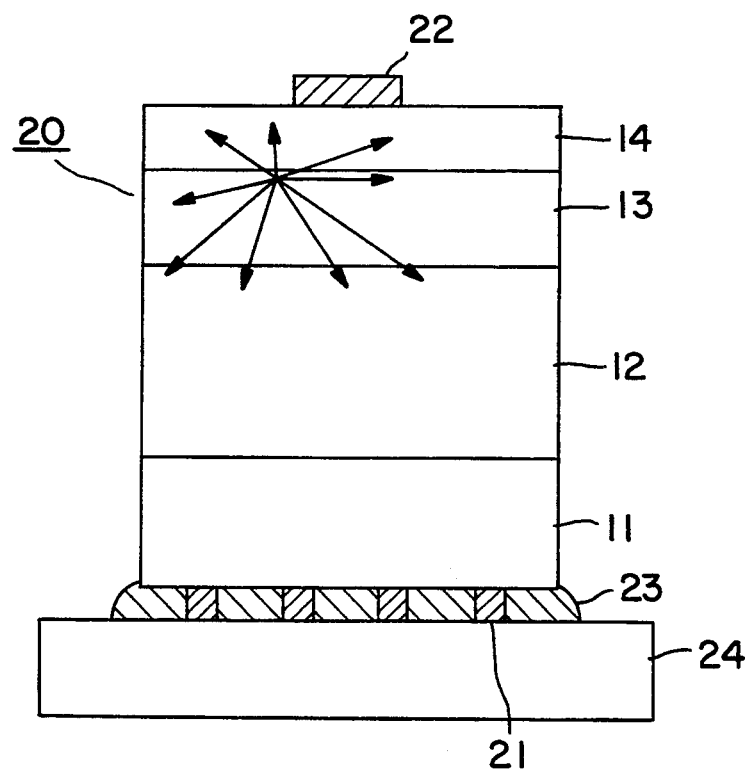
FIG. 2 shows a schematic sectional view of an example of a GaP light emitting diode.

FIG. 2 shows the cross-sectional structure of a green light emitting GaP light emitting diode 20 manufactured by using said GaP light emitting element substrate 10. This GaP light emitting diode 20 has the following structure: the light emitting diode chip comprising the GaP light emitting element substrate 10 with the n electrode 21 on the side of the n-type GaP single crystal substrate 11 and the p electrode 22 on the side of the p-type GaP layer 14 is adhered to the support member 24 via the conductive paste 23 (Ag paste, for example), and, after wire bonding (not shown in the figure) is carried out, they are sealed with epoxy resin (not shown in the figure).

When a forward current 20 is applied to the GaP light emitting diodes as described above, green light emission occurs in the proximity of the pn junction and the light is irradiated in all directions as indicated in FIG. 2. These emitted lights can be divided into the light components X, Y and Z, which are irradiated from the light emitting point toward the surfaces, that is, in the direction of the upper surface (the surface on the side of the p electrode 22), in the direction of the lateral surfaces, and in the direction of the lower surface (the surface of the support member 24), respectively. These light components X, Y and Z can be further divided into the light components which are internally absorbed before reaching the surfaces ($X_1$, $Y_1$ and $Z_1$), the light components which reach the surfaces and directly go out ($X_2$, $Y_2$ and $Z_2$, except that $Z_2$ will reflect on the Ag paste surface 23 and go back into the GaP light emitting elements substrate 10), and the light components which reach the surfaces and reflect internally ($X_3$, $Y_3$ and $Z_3$). Of these, the light components $Z_2$, $X_3$, $Y_3$ and $Z_3$ will either go out after one or multiple reflections, or be absorbed during these reflections.

of these emitted light components, the components which would go through said n-type GaP buffer layer 12 once or more times are a part of $Y_1$ (that is, $y_1$), all of $Z_1$, a part of $Y_2$ ($y_2$), all of $Z_2$, a part of $X_3$ ($x_3$), a part of $Y_3$ ($y_3$) and all of $Z_3$. The total of them, i.e. $y_1+Z_1+y_2+Z_2+x_3+y_3+Z_3$, constitutes a very large portion of the total emitted light.

The inventors earnestly conducted investigation based on this fact, and found out that the transmission characteristics, for the emitted light, of the n-type GaP buffer layer 12, through which the emitted light has a very high probability of traveling, have a particularly significant influence on the brightness of the light emitting diode.

The inventor further conducted investigation and found out that the transmission characteristics, for the emitted light, of the n-type GaP buffer layer 12 is influenced by the oxygen concentration in the n-type GaP buffer 12, and that the transmission characteristics for the emitted light improve as the oxygen concentration lowers. That is, a significant correlation between the oxygen concentration in the n-type GaP buffer 12 and the transmission ratio was observed, and the inventors discovered that keeping the oxygen concentration in the n-type GaP buffer low would lead to improved brightness of the light emitting diodes, and thus completed this invention.

Figure 3A:
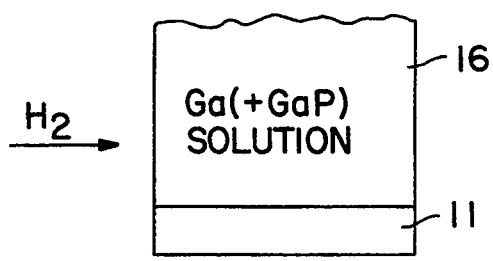
FIGS. 3(a) through 3(f) are a process diagram which shows an example of a method of manufacturing GaP light emitting element substrates.

An example of the GaP light emitting element substrate of this invention is described next in detail. First, an example of the method of manufacturing the GaP light emitting element substrate of this invention is described by referring to FIGS. 3(a) through 3(f). As shown in FIG. 3(a), a Ga solution 16 at 1060° C. into which GaP poly-crystals and Te, which is to be an n-type dopant, are dissolved is placed on a GaP single crystal substrate 11. This Ga solution 16 is a GaP saturated solution at 1060° C. into which Te, which is to be an n-type dopant, is added.

Then, the temperature of the system which includes said Ga solution 16 is gradually lowered, so that GaP dissolved in the Ga solution 16 precipitates on the n-type GaP single crystal substrate 11. Thus, the multi-layer GaP substrate 15 comprising the GaP buffer layer 12 doped with Te formed on the n-type GaP single crystal substrate 11 is obtained (FIG. 3(b)).

Figure 3C:
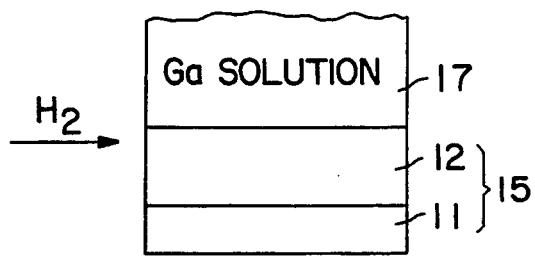
Figure 3B:
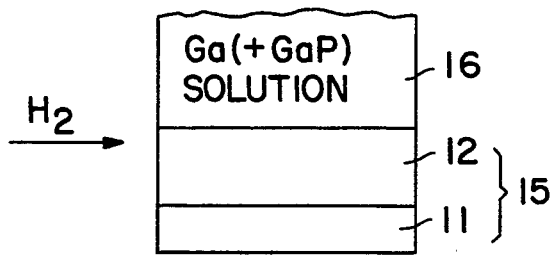
Figure 3D:
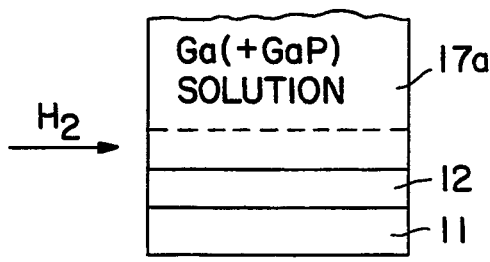
Figure 3E:
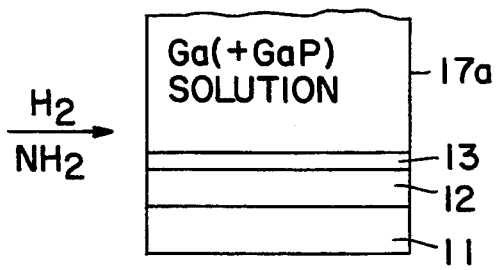
Figure 3F:
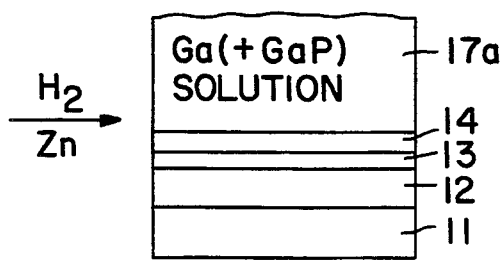

Next, as shown in FIG. 3(c), fused Ga 17 without an n-type dopant is placed on said multi-layer GaP substrate 15. At this time, the temperature is set at 600° C.

Then, the temperature of the system which contains said fused Ga 17 is raised to 1000° C. The upper portion of the n-type GaP buffer layer 12 gradually dissolves into fused Ga 17, and this fused Ga becomes a saturated solution of GaP at 1000° C. (Ga solution 17a). Here, Te which is contained in the n-type GaP buffer layer 12 also dissolves in said Ga solution 17a (FIG. 3(d)).

Next, the temperature is lowered to grow the n-type GaP layer 13 doped with the n-type dopant (Te). Here, during the second half of the growth process, the flow of $NH_3$ along with the carrier gas $H_2$ is introduced for nitrogen (N) doping (FIG. 3(e)).

Then, the $NH_3$ flow is stopped, the temperature of the system, to which Zn is added here, is raised to about 700° C., and then the temperature is lowered. Thus Zn flows along with the carrier gas $H_2$, and the p-type GaP layer 14 doped with Zn is formed on the nitrogen-doped n-type GaP layer 13 (FIG. 3(f)).

In the manner described above, the n-type GaP buffer layer 12, the n-type GaP layer 13, and the p-type GaP layer 14 are formed one after another on the n-type GaP single crystal substrate 11 to prepare the light emitting element substrate, and this light emitting element substrate is made into elements to obtain light emitting diodes with green light emission.

In the process described above, the oxygen concentration in the n-type GaP buffer layer 12 is influenced by, for example, the quality of the Ga solution 16 and the contamination of the growth jigs such as boats which are used to grow each layer. Therefore, in order to keep the oxygen concentration low, it is necessary to use raw materials with low oxygen concentrations for GaP poly-crystals and fused Ga, and to bake the jigs such as boats thoroughly, and it is also necessary to prevent oxidation and adsorption of oxygen and oxides during the process.

Figure 4:
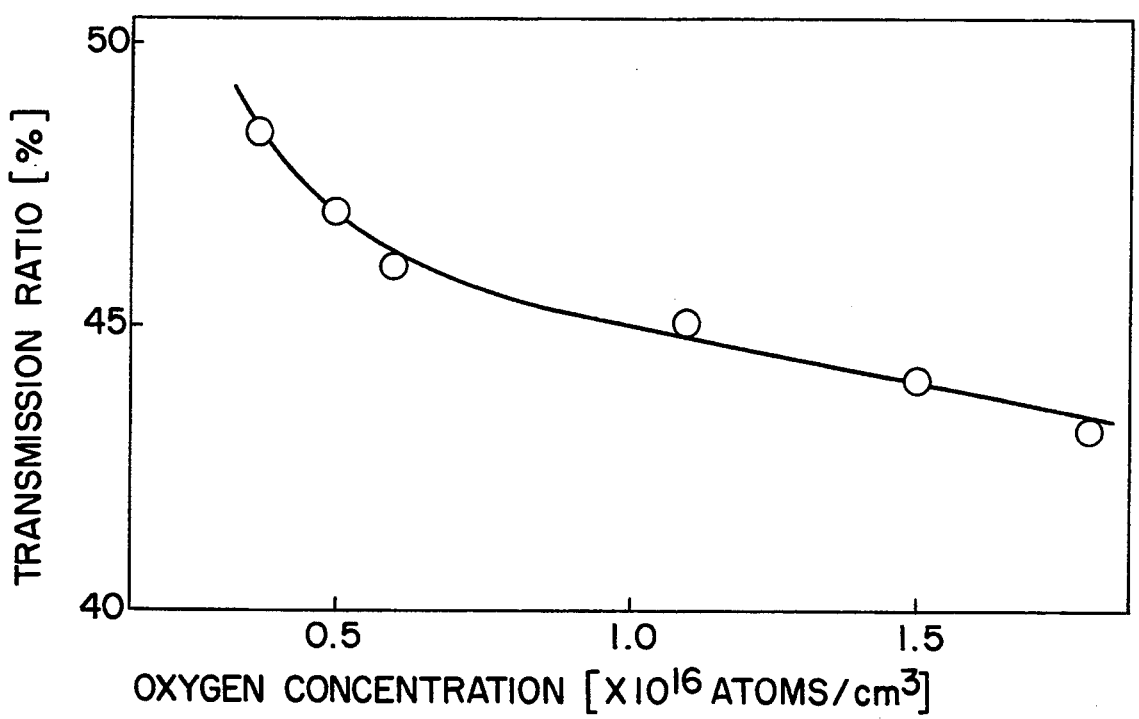
FIG. 4 shows a graph which shows the relationship between the oxygen concentration in the n-type GaP buffer layer and the transmission ratio of the light with a wavelength of 570 nm.

FIG. 4 shows the change in the light transmission characteristics depending on the oxygen concentration in the n-type GaP buffer layer. Actual light transmittance measurement was conducted on multi-layer GaP substrates with approximately 150 micrometer thick n-type GaP buffer layers, approximately 50 micrometer thick n-type GaP single crystal substrates, and with a total thickness of approximately 200 micrometers. That is, a plurality of multi-layer GaP substrates with various oxygen concentrations in the n-type GaP buffers were prepared, light with a wavelength of 570 nm (equivalent of the emitted light) was applied on the main surfaces of these multi-layer GaP substrates, the quantity of light was measured before and after the transmission for each multi-layer GaP substrate, and the ratio of the quantity of light after the transmission and the quantity of light before the transmission was indicated as a percentage (hereafter, this value is referred to as the "transmission ratio").

As shown in the figure, as the oxygen concentration in the n-type GaP buffer layer increases, the transmission ratio decreases and it becomes harder for the light with the wavelength of 570 nm (equivalent of the emitted light) to penetrate (the internal absorption increases).

Figure 5:
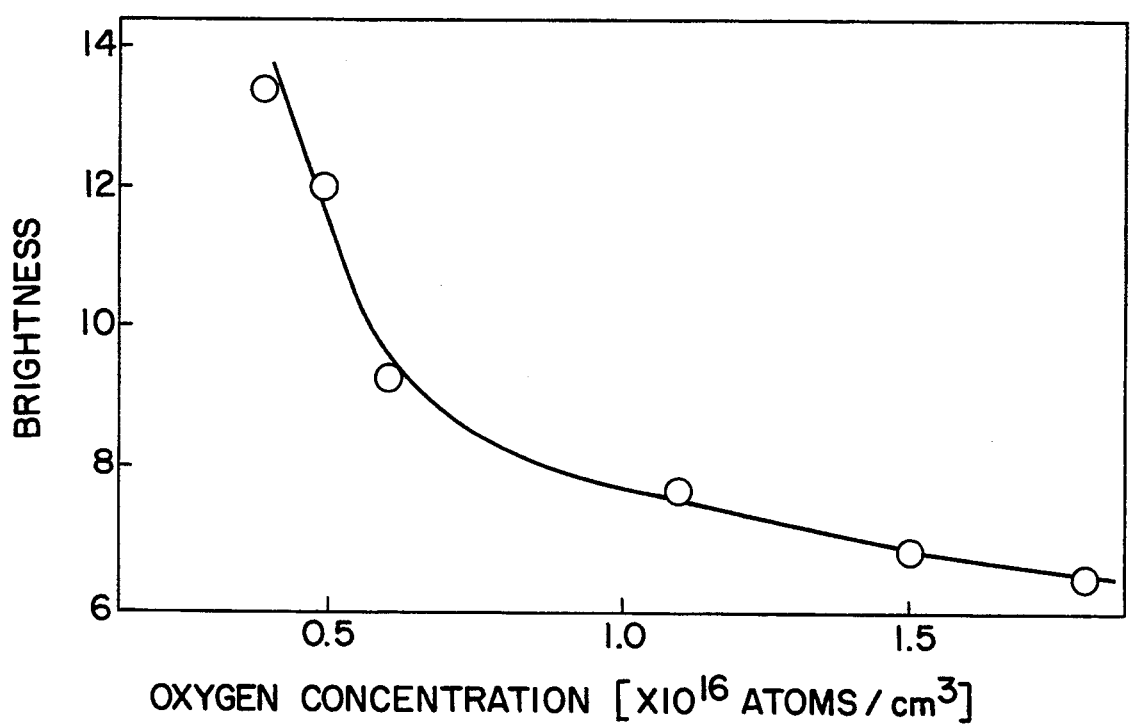
FIG. 5 is a graph which shows the relationship between the oxygen concentration in the n-type GaP buffer layer and the brightness of the light emitting diodes.

FIG. 5 shows the results of the measurement of the brightness (relative values) of the light emitting diodes which were obtained by, as described above, layering the n-type GaP layer and the p-type GaP layer one after another on each multi-layer GaP substrate which was used for the transmission ratio measurement, and by making it into an element.

As shown in the figure, as the oxygen concentration in the n-type GaP buffer layer increases, the brightness of the light emitting diode decreases. In particular, the brightness sharply drops when the oxygen concentration exceeds $6 \times 10^{15}$ [atoms/$cm^3$].

This result indicates that, in order to obtain light emitting diodes with high brightness, it is sufficient to keep the oxygen concentration in the n-type GaP buffer layer at $6 \times 10^{15}$ [atoms/cm$^3$] or less so that the internal absorption is small.

As described thus far, by using this invention, it is possible to obtain green light emitting GaP light emitting diodes with high brightness by keeping the oxygen concentration in the n-type GaP buffer layer of the GaP light emitting substrate at $6 \times 10^{15}$ [atoms/cm$^3$] or less.

What is claimed is:

1. A GaP light emitting element substrate comprising an n-type GaP buffer layer, an n-type GaP layer and a p-type GaP layer layered one after another on an n-type GaP single crystal substrate, wherein the oxygen concentration in said n-type GaP buffer layer is $6 \times 10^{15}$ [atoms/cc] or less.

* * * * *